United States Patent
Sugimura

(10) Patent No.: US 9,103,890 B2
(45) Date of Patent: Aug. 11, 2015

(54) SEMICONDUCTOR CIRCUIT, BATTERY MONITORING SYSTEM, AND DIAGNOSIS METHOD

(71) Applicant: LAPIS Semiconductor Co., Ltd., Yokohama (JP)

(72) Inventor: Naoaki Sugimura, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 246 days.

(21) Appl. No.: 13/803,175

(22) Filed: Mar. 14, 2013

(65) Prior Publication Data
US 2013/0241566 A1    Sep. 19, 2013

(30) Foreign Application Priority Data
Mar. 16, 2012   (JP) ................ 2012-060897

(51) Int. Cl.
G01R 31/327    (2006.01)
G01R 31/02     (2006.01)
G01R 31/36     (2006.01)

(52) U.S. Cl.
CPC ........ *G01R 31/3606* (2013.01); *G01R 31/3648* (2013.01); *G01R 31/362* (2013.01); *G01R 31/3658* (2013.01)

(58) Field of Classification Search
CPC ... Y02E 60/12; G01R 31/3658; H02J 7/0021; H02J 7/0016; Y02T 10/7055
USPC ........................................... 324/433
See application file for complete search history.

(56) References Cited

U.S. PATENT DOCUMENTS

| | | | |
|---|---|---|---|
| 2007/0285083 A1* | 12/2007 | Kamata | 324/120 |
| 2008/0030172 A1* | 2/2008 | Darzy | 320/153 |
| 2008/0036424 A1* | 2/2008 | Saigo | 320/136 |
| 2009/0174411 A1* | 7/2009 | Yudahira et al. | 324/433 |

FOREIGN PATENT DOCUMENTS

| | | |
|---|---|---|
| JP | 8-189845 A | 7/1996 |
| JP | 2010-016928 A | 1/2010 |

* cited by examiner

*Primary Examiner* — Arun Williams
(74) *Attorney, Agent, or Firm* — Rabin & Berdo, P.C.

(57) ABSTRACT

A semiconductor circuit, battery monitoring system, diagnostic program and diagnosis method are provided enabling appropriate self-diagnosis of a measurement unit. An output value (A−B) output through respective power supply lines V (Vn, Vn−1), a cell selector switch, and a level shift circuit from an AD converter and an output value (B) of a directly input reference voltage B output from the AD converter are summed together. Diagnosis is made that no abnormality such as a defect has occurred when the summed value is substantially the same as a reference voltage A.

10 Claims, 10 Drawing Sheets

SEMICONDUCTOR CIRCUIT, BATTERY MONITORING SYSTEM, AND DIAGNOSIS METHOD

CROSS-REFERENCE TO RELATED APPLICATION

This application is based on and claims priority under 35 USC 119 from Japanese Patent Application No. 2012-060897 filed on Mar. 16, 2012, the disclosure of which is incorporated by reference herein.

BACKGROUND

1. Technical Field

The present invention relates to a semiconductor circuit, a battery monitoring system, and a diagnosis method. The present invention particularly relates to a semiconductor circuit that measures the voltage of plural serially connected batteries and to a battery monitoring system, and a diagnosis method of the same.

2. Related Art

High capacity, high output batteries employed for example for motor drive in hybrid vehicles and electric vehicles generally employ a battery configured from plural serially connected batteries (battery cells) (a specific example being a lithium ion battery). Known battery monitoring systems for monitoring and control measure the battery voltage of the cells of such a battery.

A related battery monitoring system is known that measures the battery voltage of each battery cell by the difference between the voltage at the high voltage side and the voltage at the low voltage side of plural serially connected battery cells. For example, technology is disclosed in Japanese Patent Application Laid-Open (JP-A) No. 2010-16928 wherein any (two) terminals to which power supply lines connected to respective battery cells are connected are selected by a multiplexer, and output to a differential amplifier. Analog electrical signals output from the differential amplifier are converted to digital electrical signals and then output. The battery voltage of the respective battery cells is measured based on the digital electrical signals.

A digital measurement instrument including a self-diagnostic function is also disclosed in JP-A No. 8-189845. In the digital measurement instrument disclosed in JP-A No. 8-189845, as illustrated in FIG. 10, a single input circuit is configured by a range switching circuit 109 that switches the gain, and includes a function for performing self-diagnosis of the single input circuit (the range switching circuit 109). In the range switching circuit 109 illustrated in FIG. 10, the gain is switched by connecting switching elements SW192, 193 connected to an NC side or to an NO side.

For example, if the gain of the range switching circuit 109 is denoted gain G1 and gain G2, then the ratio between the gain G1 and the gain G2 is derived by inputting a reference voltage A to the range switching circuit 109, and performing analogue to digital (AD) conversion of value G1×A obtained as gain G1, and value G2×A obtained as gain G2. Diagnosis is then made as to whether or not the gain switching is correct.

However, in the technology disclosed in JP-A No. 8-189845, since in the range switching circuit 109 the precision of the gain G1 itself and the gain G2 itself is diagnosed, the precision of the reference voltage A must be the same as or better than the input-output conversion precision of the circuit subject to self-diagnosis.

In the self-diagnosis technology of JP-A No. 8-189845, when applied to a differential input circuit as the circuit for self-diagnosis, a reference voltage B (power source for supplying the reference voltage B) is required to additionally supply the reference voltage B to perform self-diagnosis due to there being to two systems for input. An issue thus arises in that, similarly to with the reference voltage A described above, the precision of the reference voltage B must also be the same as or greater than the input-output conversion precision of the circuit subject to self-diagnosis.

Hence in a battery monitoring system such as that of the technology disclosed in JP-A No. 2010-16928, a differential amplifier is employed, and the above issue arises when the self-diagnosis technology of the JP-A No. 8-189845 is applied to self-diagnosis technology of a differential amplifier. As a result there is a concern of being unable to perform self-diagnosis appropriately.

SUMMARY

The present invention is proposed to address the above issues, and an object thereof is to provide a semiconductor circuit, a battery monitoring system, and a diagnosis method capable of appropriately performing self-diagnosis on a measurement unit.

In order to achieve the above objective, a semiconductor circuit of a first aspect includes: plural power supply lines respectively connected to each of plural serially connected batteries; a selection unit that selects two power supply lines from the plural power supply lines; a measurement unit that includes an analogue signal to digital signal conversion unit and that, when input with respective electrical signals flowing in the two power supply lines selected by the selection unit, converts a difference between the electrical signals flowing in the two power supply lines into a digital signal and outputs the digital signal; a computation unit that performs a predetermined computation on the digital signal output from the measurement unit and outputs an electrical signal corresponding to a result of the computation; and a control unit that performs first control processing and second control processing. The first control processing controls the selection unit such that selection is made from the plural power supply lines of a power supply line in which an electrical signal corresponding to a first reference voltage flows and a power supply line in which an electrical signal corresponding to a second reference voltage different from the first reference voltage flows. The second control processing controls the measurement unit such that an electrical signal corresponding to the second reference voltage is converted into a digital signal and output.

A battery monitoring system according to a second aspect includes: plural serially connected batteries; plural power supply lines respectively connected to each of the plural batteries; a selection unit that selects two power supply lines from the plural power supply lines; a measurement unit that includes an analogue signal to digital signal conversion unit and that, when input with electrical signals flowing in the two power supply lines selected by the selection unit, the measurement unit converts a difference between the electrical signals flowing in the two power supply lines into a digital signal and outputs the digital signal in order to monitor battery voltage of the plural batteries; a computation unit that performs a predetermined computation on the digital signal output from the measurement unit and outputs an electrical signal corresponding to a result of the computation; and a control unit that when performing diagnosis for an abnormality in the measurement unit performs first control processing and second control processing. The first control processing controls the selection unit such that selection is made from the plural power supply lines of a power supply line in which an electrical signal corresponding to a first reference voltage flows and a power supply line in which an electrical signal corresponding to a second reference voltage different from the first reference voltage flows. The second control processing controls the measurement unit such that an electrical signal corresponding to the second reference voltage is converted into a digital signal and output.

A diagnosis method according to a third aspect is applied to a semiconductor circuit including plural power supply lines respectively connected to each of plural serially connected batteries, a selection unit that selects two power supply lines from the plural power supply lines, and a measurement unit that includes an analogue signal to digital signal conversion unit and that, when input with respective electrical signals flowing in the two power supply lines selected by the selection unit, converts a difference between the electrical signals flowing in the two power supply lines into a digital signal and outputs the digital signal. The diagnosis method includes: a first control process that controls the selection unit such that selection is made from the plural power supply lines of a power supply line in which an electrical signal corresponding to a first reference voltage flows and a power supply line in which an electrical signal corresponding to a second reference voltage different from the first reference voltage flows; a second control process that controls the measurement unit such that an electrical signal corresponding to the second reference voltage is converted into a digital signal and output; and a computation process that sums together the digital signal output by the first control process and the digital signal output by the second control process in a computation unit and outputs the sum as an electrical signal.

BRIEF DESCRIPTION OF THE DRAWINGS

Exemplary embodiments of the present invention will be described in detail based on the following figures, wherein.

DETAILED DESCRIPTION

Explanation follows regarding an outline of an overall battery monitoring system of the present exemplary embodiment, with reference to the drawings.

Figure 1:
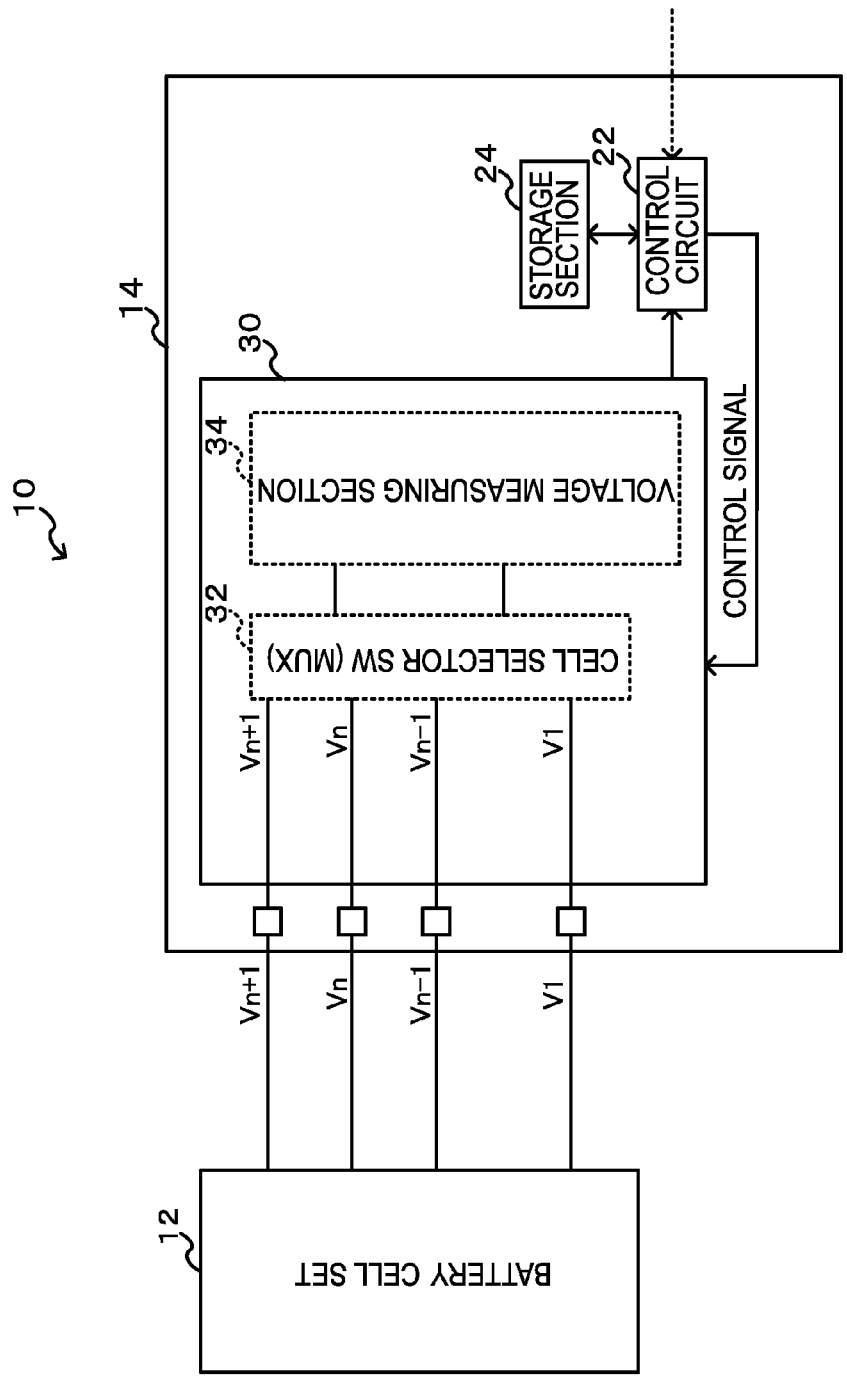
FIG. 1 is a circuit diagram illustrating an example of a schematic configuration of a battery monitoring system of a present exemplary embodiment.

Explanation first follows regarding a configuration of a battery monitoring system according to the present exemplary embodiment. An example of a schematic configuration of a battery monitoring system of the present exemplary embodiment is illustrated in FIG. 1. The battery monitoring system of the present exemplary embodiment illustrated in FIG. 1 includes a battery cell set 12 containing plural battery cells, and a semiconductor circuit 14 that measures the voltage of each of the battery cells of the battery cell set 12.

Figure 2:
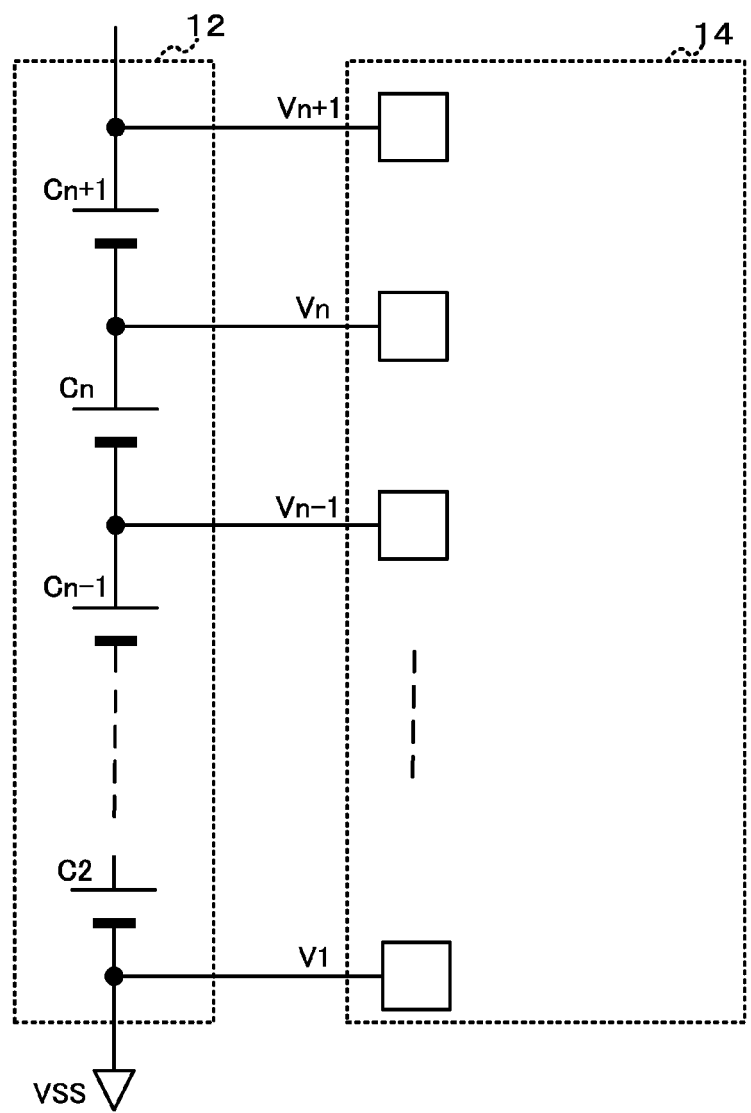
FIG. 2 is a circuit diagram illustrating an example of a configuration of a battery cell set of the present exemplary embodiment.

The battery cell set 12 is, as illustrated in FIG. 2, configured by plural serially connected battery cells C. Note that FIG. 1 and FIG. 2 illustrate a specific example of a case in which n individual battery cells C (C1 to Cn+1) are serially connected together. Note that in the present exemplary embodiment, battery cell Cn+1 is at the highest voltage side in the battery cell set 12, and battery cell C2 is at the lowest voltage side. Power supply lines V (V1 to Vn+1) of the semiconductor circuit 14 are connected through terminals (pads) to the high voltage side and the low voltage side of each of the battery cells C (between the battery cells C).

The semiconductor circuit 14 includes a control circuit 22, a storage section 24, and a voltage measuring circuit 30 with a self-diagnostic function (referred to below simply as voltage measuring circuit 30).

The voltage measuring circuit 30 has a function that measures the battery voltage of each of the battery cells C based on the difference between the voltage on the high voltage side and the voltage on the low voltage side of each of the battery cells C. The voltage measuring circuit 30 in the present exemplary embodiment includes a cell selector SW 32 and a voltage measuring section 34. The cell selector SW 32 selects the power supply line V connected to the high voltage side and the power supply line V connected to the low voltage side of the battery cell C for each of the battery cells C, and outputs corresponding respective electrical signals (analogue signals) to the voltage measuring section 34. The voltage measuring section 34 includes a function to convert a difference between the electrical signal corresponding to the power supply line V connected to the high voltage side and the electrical signal corresponding to the power supply line V connected to the low voltage side of a given battery cell C output from the cell selector SW 32 into a digital signal, and to output the converted electrical signal (digital signal) to the control circuit 22.

The voltage measuring circuit 30 of the present exemplary embodiment includes a self-diagnostic function (described in detail later) that measures whether or not the battery voltage is being appropriately measured by the voltage measuring section 34.

The control circuit 22 is a logic circuit including a function to output a control signal to measure the battery voltage of each of the battery cells C using the voltage measuring circuit 30, and to output a control signal to cause the voltage measuring circuit 30 to perform self-diagnosis. On receipt of a battery voltage measurement instruction or a self-diagnosis instruction, the control circuit 22 executes a program and outputs a control signal to the voltage measuring circuit 30.

The storage section 24 includes a function to store data such as an output value (A−B) and an output value (B), described in detail later, and is, for example, configured by a register, a hard disk, or a memory.

Figure 3:
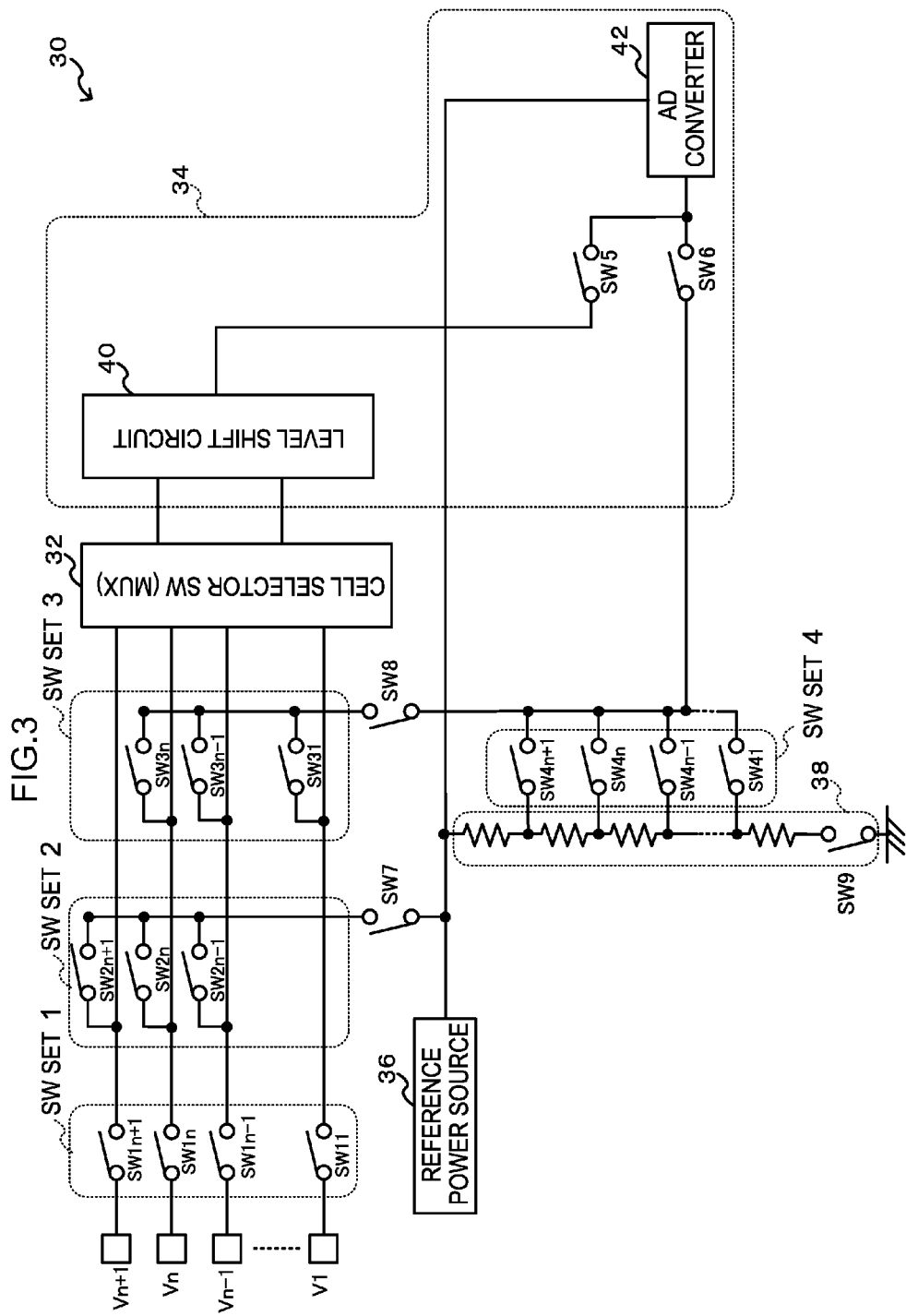
FIG. 3 is a circuit diagram illustrating an example of a voltage measurement circuit including a self-diagnostic function in a semiconductor circuit of the present exemplary embodiment.

Detailed explanation now follows regarding the voltage measuring circuit 30. FIG. 3 illustrates an example of a configuration of the voltage measuring circuit 30 of the present exemplary embodiment. As illustrated in FIG. 3, the voltage measuring circuit 30 of the present exemplary embodiment is configured including the cell selector SW 32, the voltage measuring section 34, a reference power source 36, a reference voltage dividing resistor 38, an SW set 1, an SW set 2, an SW set 3, an SW set 4, a switching element SW 7, and a switching element SW8.

The SW set 1 includes switching elements SW1 (SW 11 to SW 1$n$+1) corresponding to the respective power supply lines V, and includes a function for switching the connection state between the cell selector SW 32 and the battery cell set 12 (the battery cells C). Input of voltage (battery voltage) to the cell selector SW 32 from the battery cell set 12 (the battery cells C) can be interrupted by switching the SW set 1 to an OFF state.

The SW set 2 includes switching elements SW2 (SW 22 to SW 2$n$+1) corresponding to the respective power supply lines V that are connected to the high voltage side of each of the battery cells C, and includes a function for connecting between the cell selector SW 32 and high voltage side of the battery cells C when performing self-diagnosis.

The SW set 3 includes switching elements SW3 (SW 31 to SW 3$n$) corresponding to the respective power supply lines V connected to the low voltage side of each of the battery cells C, and includes a function for connecting between the cell selector SW 32 and low voltage side of the battery cells C when performing self-diagnosis.

When measuring the battery voltage of the battery cells C of the battery cell set 12, the cell selector SW 32, as described above, includes a function to select the power supply line V connected to the high voltage side and the power supply line V connected to the low voltage side of a given battery cell C, and to output corresponding electrical signals (analogue signals) to a level shift circuit 40 (to the voltage measuring section 34).

There is no particular limitation to the cell selector SW 32 as long as it includes a function to select an electrical signal flowing in a specific power supply line out of the power supply lines V and to output the selected electrical signal to the level shift circuit 40. In the present exemplary embodiment, as an example, the cell selector SW 32 is configured by a multiplexer (MUX) including switching elements SW for each of the respective power supply lines V.

The cell selector SW 32 of the present exemplary embodiment also includes a function when performing self-diagnosis to select specific power supply lines V (in the present exemplary embodiment the power supply line V connected to the high voltage side and the power supply line V connected to the low voltage side of the battery cells C) and to output a corresponding electrical signal (analogue signal) to the level shift circuit 40 (to the voltage measuring section 34).

The reference power source 36 includes a function to generate and supply a reference voltage A. The reference voltage dividing resistor 38 includes a voltage dividing resistor device configured from plural serially connected resistor elements R, and a switching element SW9 that is connected to the voltage dividing resistor element and to voltage VSS (ground). The switching element SW4 includes switching elements SW4 (SW 41 to SW 4$n$+1), and includes a function when performing self-diagnosis to cause a predetermined resistance divided voltage value (reference voltage B) corresponding to the power supply line V to which self-diagnosis is to be performed to be supplied to the power supply line V. Note that in the following the reference voltage supplied from the reference power source 36 is referred to as reference voltage A, and the resistance divided voltage value that has been divided from the reference voltage A by the reference voltage dividing resistor 38 is referred to as reference voltage B.

The reference voltage A is supplied to the power supply line V by switching the switching element SW7 and a specific switching element SW2 of the SW set 2 to the ON state. The reference voltage B is supplied to the power supply line V by switching the switching element SW9, a specific switching element SW4 of the SW set 4, the switching element SW8, and a specific switching element SW3 of the SW set 3 to the ON state.

The voltage measuring section 34 of the present exemplary embodiment includes the level shift circuit 40, an AD converter 42, a switching element SW5 and a switching element SW6.

The level shift circuit 40 includes a function for outputting an analogue electrical signal corresponding to the difference between two electrical signals input from the cell selector SW 32. The level shift circuit 40 is employed in this manner in the present exemplary embodiment, however there is no limitation thereto. There are no particular limitations to configuration as long as a function is included to output an analogue electrical signal corresponding to the difference between two electrical signals input from the cell selector SW 32.

The AD converter 42 is an analogue to digital converter including a function to convert an input analogue electrical signal into a digital signal and output the digital signal. The analogue electrical signal output from the level shift circuit 40 is converted into a digital signal and output when the switching element SW5 is in the ON state. However an analogue electrical signal corresponding to the reference voltage B is converted into a digital signal and output when the switching element SW6 is in the ON state.

Note that in the present exemplary embodiment, ON/OFF switching of each of the switching elements SW (SW1 to SW4) of the SW set 1 to the SW set 4, the switching elements SW in the cell selector SW 32, and the switching element SW5 to the switching element SW9 is controlled by respective control signals input from the control circuit 22.

Figure 4:
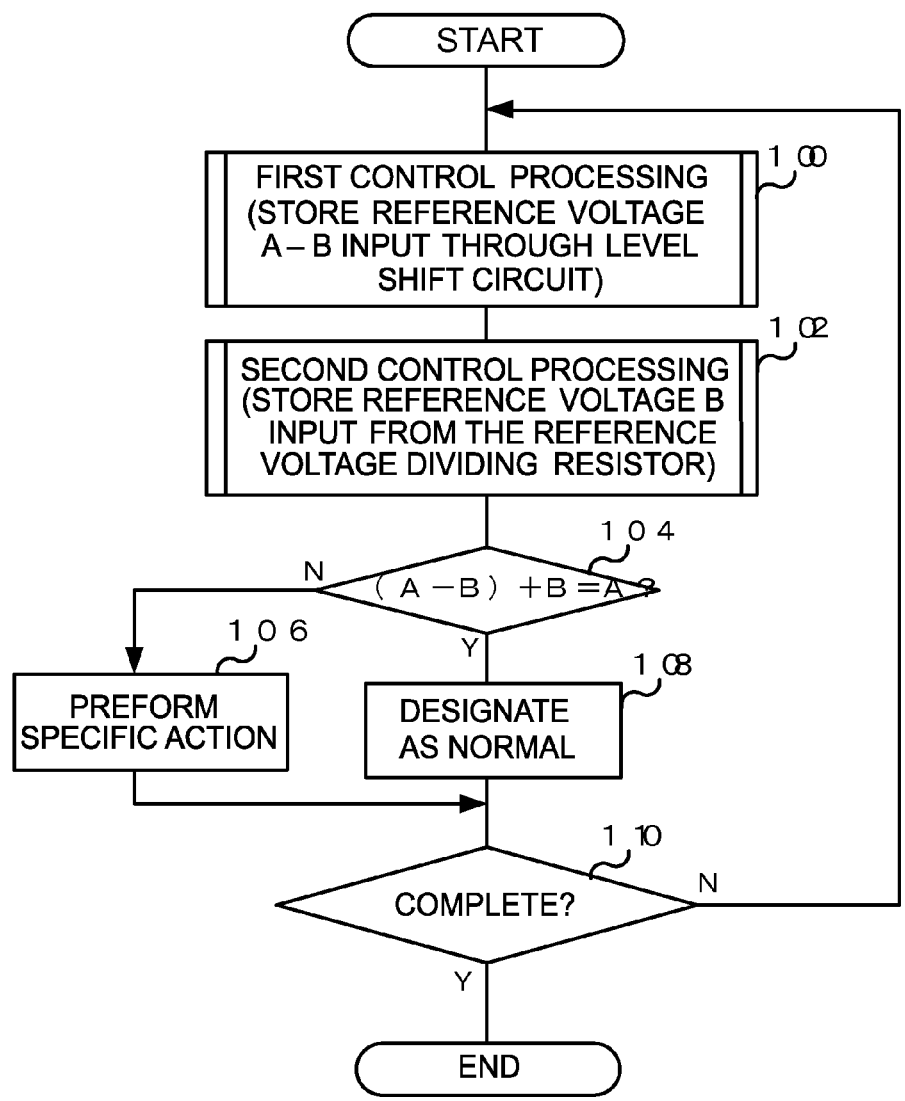
FIG. 4 is a flow chart of an example of overall flow of self-diagnosis operation of a voltage measuring circuit in a semiconductor circuit of the present exemplary embodiment.
Figure 6:
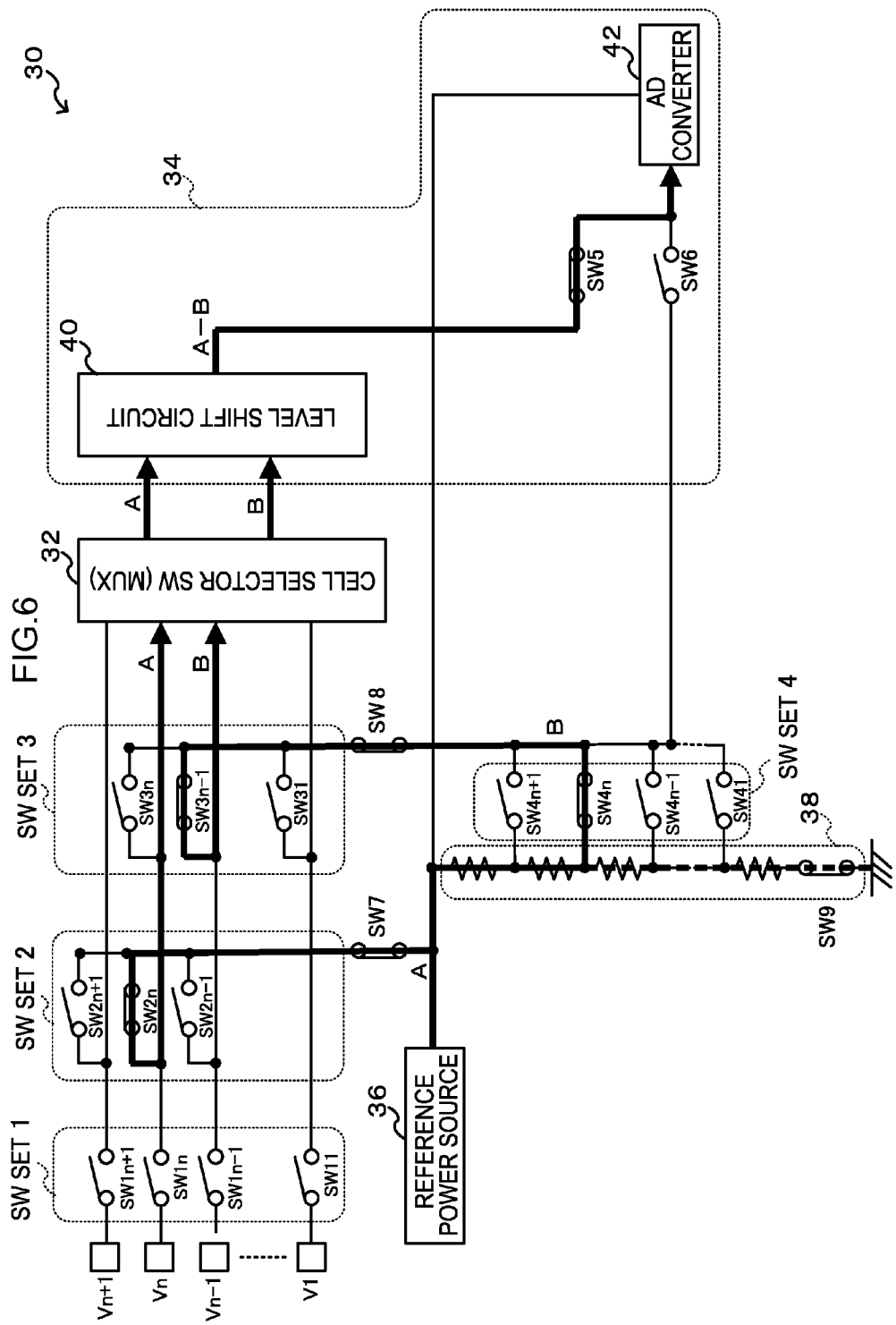
FIG. 6 is circuit diagram illustrating a specific example of a state in a voltage measurement circuit when a power supply line Vn and a power supply line Vn−1 have been selected when performing self-diagnosis.
Figure 8:
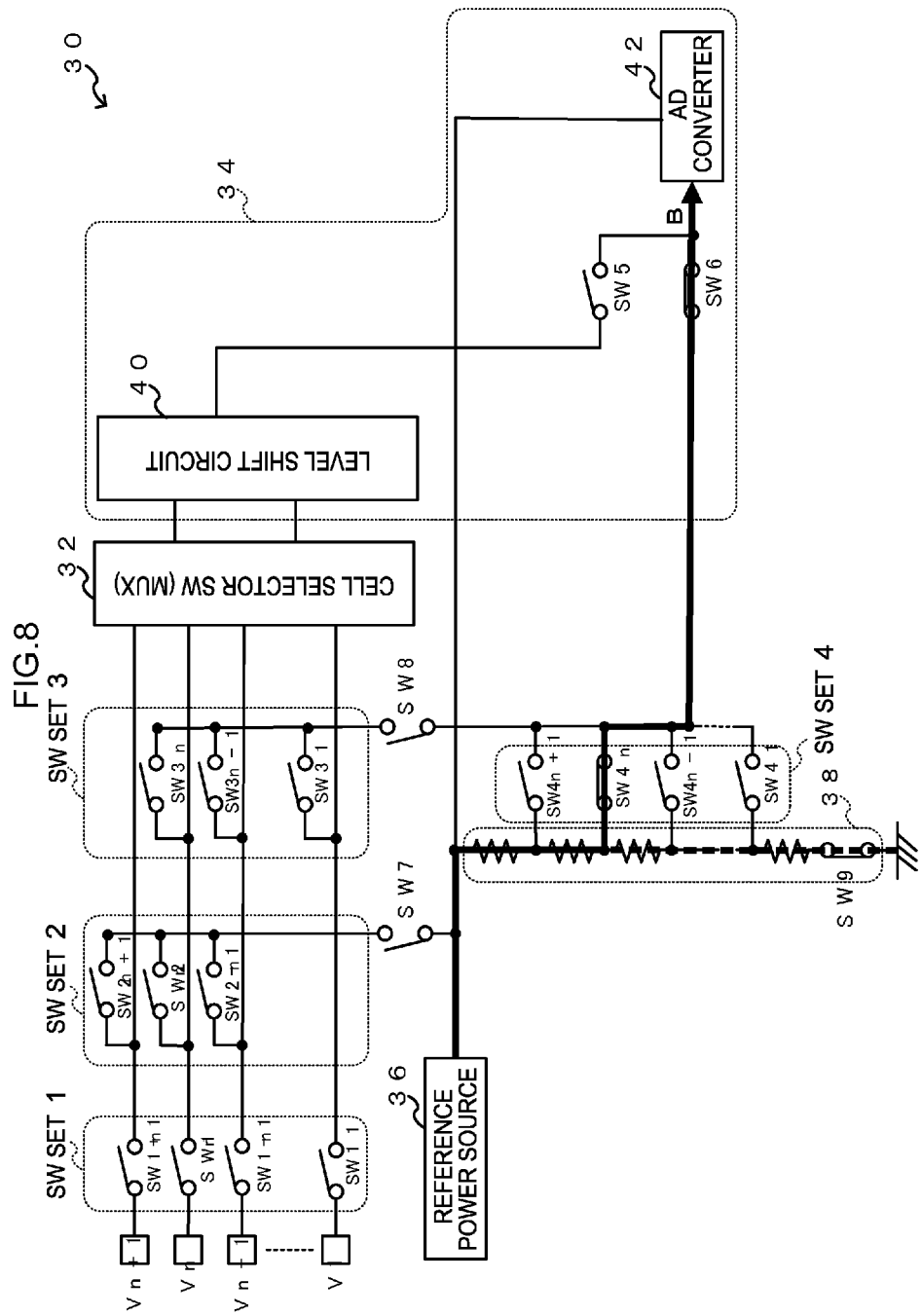
FIG. 8 is a circuit diagram illustrating a specific example of a state in a voltage measurement circuit when a power supply line Vn and a power supply line Vn−1 have been selected when performing self-diagnosis.

Explanation next follows regarding the self-diagnostic function of the voltage measuring circuit 30 in the semiconductor circuit 14 of the present exemplary embodiment. A flow chart of an example of overall flow of self-diagnosis operation in the present exemplary embodiment is illustrated in FIG. 4. The operation is controlled for example by the control circuit 22 executing a diagnostic program. Note that as a specific example explanation follows of a case in which the power supply line Vn and the power supply line Vn−1 are selected and self-diagnosis performed thereon. Circuit diagrams illustrating states of the voltage measuring circuit 30 are illustrated in FIG. 6 and FIG. 8 for the case of the specific example.

Note that in the present exemplary embodiment, when performing self-diagnosis, in the initial state each of the switching elements SW (SW1 to SW4) of the SW set 1 to SW set 4, the switching elements SW in the cell selector SW 32, and the switching element SW5 to the switching element SW9 are in the OFF state.

First, at step 100, the control circuit 22 performs first control processing. The first control processing is processing that controls such that an electrical signal corresponding to the reference voltage A and an electrical signal corresponding to the reference voltage B are input from the cell selector SW 32 to the level shift circuit 40, and such that an electrical signal (an electrical signal corresponding to reference voltage A—reference voltage B) is output from the level shift circuit 40 through the AD converter 42 and stored in the storage section 24.

Figure 5:
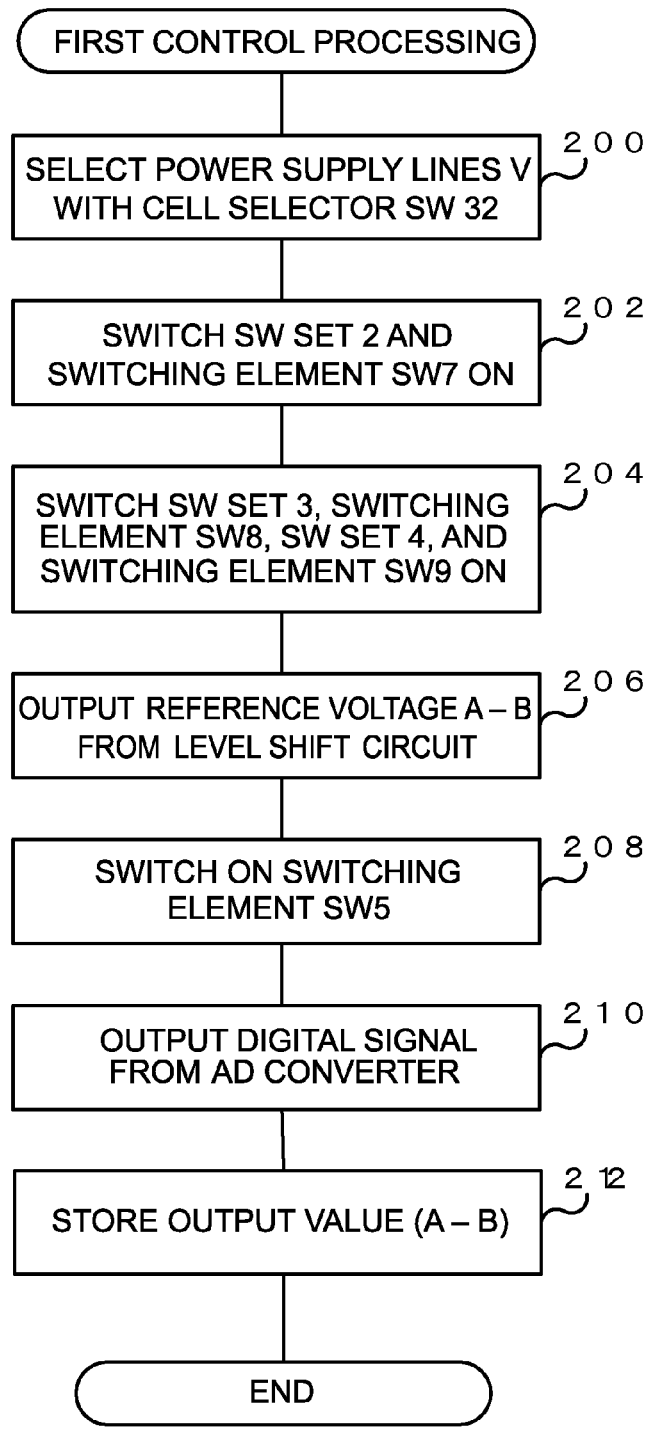
FIG. 5 is a flow chart illustrating an example of flow of first control processing in a self-diagnosis operation of the present exemplary embodiment.

A flow chart of an example of the first control processing is illustrated in FIG. 5.

At step 200, the control circuit 22 uses the cell selector SW 32 to select the power supply lines V corresponding to the power supply lines V (the battery cell C) for self-diagnosis. In the present exemplary embodiment, as a specific example the power supply line V and the power supply line Vn−1 are selected, as illustrated in FIG. 6.

At the next step 202, the control circuit 22 switches the switching element SW2 of the SW set 2 that is connected to the selected power supply line V (the high voltage side of the selected power supply lines V) and to the reference power source 36 to the ON state. As illustrated in FIG. 6, in this case the control circuit 22 switches the switching element SW2n to the ON state. The control circuit 22 also switches the switching element SW7 to the ON state. An electrical signal corresponding to the reference voltage A supplied from the reference power source 36 is accordingly input to the cell selector SW 32.

At the next step 204, the control circuit 22 switches the switching element SW3 of the SW set 3 for connecting the selected power supply line V (the low voltage side of the selected power supply lines V) to a switching element of the SW set 4 and to the reference voltage dividing resistor 38 to the ON state. As illustrated in FIG. 6, in this case the switching element SW3n−1 is switched to the ON state. The control circuit 22 also switches the switching element SW8 to the ON state. Moreover, the reference voltage A is divided, and the switching element SW4 of the SW set 4 corresponding to this battery cell C and the switching element SW9 are switched to the ON state such that a voltage corresponding to the battery cell C (battery cell Cn) is supplied. As illustrated in FIG. 6, the switching element SW4n of the SW set 4 is in the ON state at this stage. Note that in the present exemplary embodiment, a voltage corresponding to the respective battery cell C is supplied when such self-diagnosis is performed, however there is no limitation thereto. Configuration may be made such that another voltage is employed for self-diagnosis. Note that preferably self-diagnosis is performed in a similar state (similar conditions) to when measurement of the battery voltage of each of the battery cells C is performed, and supplying a voltage corresponding to each of the respective battery cells C as in the present exemplary embodiment enables the diagnostic precision to be raised.

An electrical signal corresponding to the reference voltage B that is the reference voltage A supplied from the reference power source 36 divided by the reference voltage dividing resistor 38 is accordingly input to the cell selector SW 32.

At the next step 206, the level shift circuit 40 outputs an electrical signal corresponding to the difference between the electrical signal corresponding to the reference voltage A and the electrical signal corresponding to the reference voltage B that have been input from the cell selector SW 32. At the next step 208, the control circuit 22 switches the switching element SW5 to the ON state. An analogue electrical signal corresponding to reference voltage A—reference voltage B is accordingly input to the AD converter 42.

At the next step 210, the control circuit 22 converts the input analogue electrical signal corresponding to the reference voltage A—reference voltage B into a digital signal and outputs the digital signal. At the next step 212, the output digital electrical signal corresponding to reference voltage A−reference voltage B (referred to below as output value (A−B)) is stored in the storage section 24, and then the current processing is ended. Note that in the present exemplary embodiment, after the first control processing has been ended, the control circuit 22 then switches each of the switching elements SW (SW1 to SW4) of the SW set 1 to SW set 4, the switching elements SW in the cell selector SW 32, and the switching element SW5 to the switching element SW9 to the OFF state.

When the first control processing of step 100 has thus been completed then, in the next step 102, the control circuit 22 performs second control processing. The second control processing is processing to control such that an electrical signal corresponding to the reference voltage B that has been directly input to the AD converter 42 from the reference voltage dividing resistor 38 is stored in the storage section 24.

Figure 7:
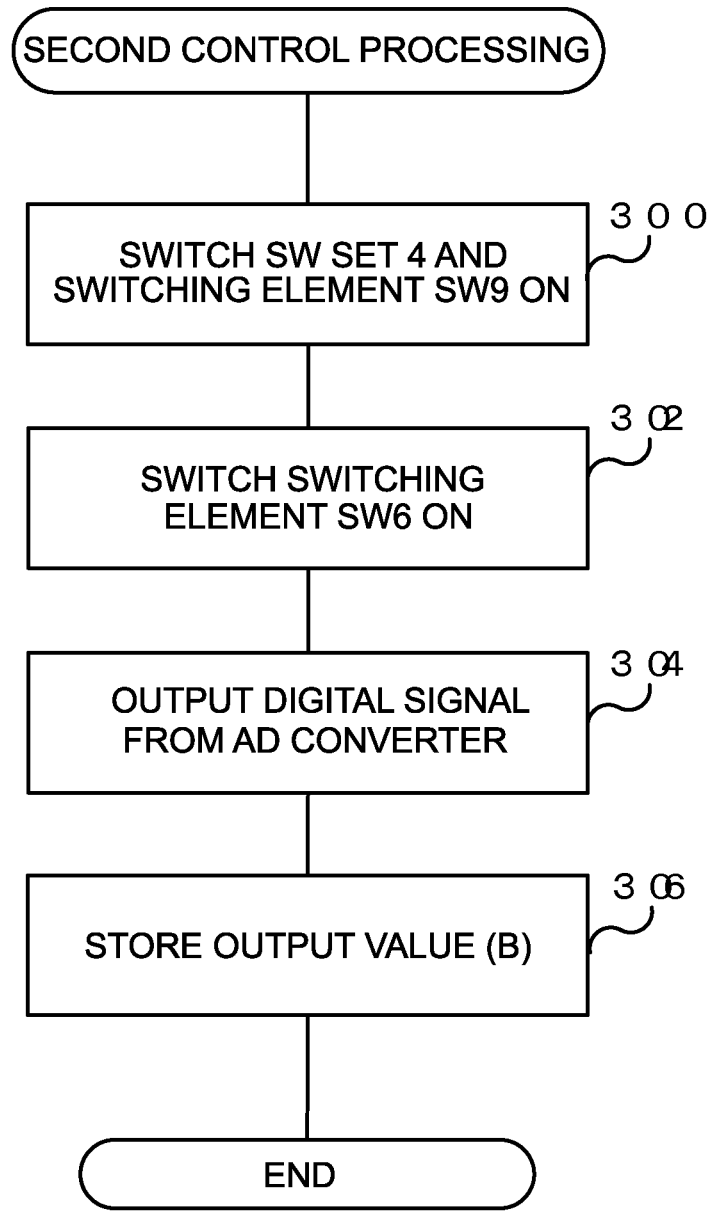
FIG. 7 is a flow chart of an example of flow of second control processing in a self-diagnosis operation of the present exemplary embodiment.

FIG. 7 illustrates a flow chart of an example of the second control processing.

At step 300, the control circuit 22 switches the switching element SW4 of the SW set 4 that is the same as the switching element SW switched on in the first control processing above and the switching element SW9 to the ON state. Then, as illustrated in FIG. 8, the control circuit 22 switches the switching element SW4n of the SW set 4 to the ON state.

At the next step 302, the control circuit 22 switches the switching element SW6 to the ON state. An electrical signal corresponding to the reference voltage B that is the reference voltage A supplied from the reference power source 36 divided by the reference voltage dividing resistor 38 is accordingly input directly to the AD converter 42.

At the next step 304, the AD converter 42 converts the analogue electrical signal corresponding to the input reference voltage B and voltage VSS (VSS=0V in the present exemplary embodiment) into a digital signal and outputs the digital signal. At the next step 306, the control circuit 22 ends the present processing after storing the digital electrical signal (referred to below as output value (B)) corresponding to the output reference voltage B (reference voltage B−0V) in the storage section 24. Note that in the present exemplary embodiment, after ending the second control processing, the control circuit 22 then switches the switching elements SW (SW1 to SW4) of the SW set 1 to SW set 4, the switching elements SW in the cell selector SW 32, and the switching element SW5 to the switching element SW9 to the OFF state.

When the second control processing of step 102 has been completed, in the next step 104, the control circuit 22 then sums together the output value (A−B) in the storage section 24 stored by the first control processing and the output value (B) stored in the storage section 24 by the second control processing, and determines whether or not the summed value is substantially the same as the reference voltage A (as the electrical signal corresponding to the reference voltage A).

When an abnormality such as a defect has not occurred in the respective power supply lines V (Vn, Vn−1), in the cell selector SW 32, or in the level shift circuit 40, the value of the sum of the output value (A−B) stored in the storage section 24 by the first control processing and the output value (B) stored in the storage section 24 by the second control processing is equivalent to the reference voltage A. Thus when determined that the sum is not the reference voltage A, this indicates that an abnormality such as a defect has occurred in the respective power supply lines V (Vn, Vn−1), in the cell selector SW 32 or in the level shift circuit 40 (in at least one thereof). Note that an exact match with the reference voltage A is not required, as long as the voltage is within a range (permissible range)

predetermined according to such factors as the precision of the voltage measuring section 34 and substantially the same as the reference voltage A.

When negative determination is made at step 104, since an abnormality has occurred the control circuit 22 proceeds to step 106, preforms a specific action, such as for example stopping operation of the battery monitoring system 10 and/or notifying the fact that an abnormality has occurred, and then proceeds to step 110. However, when affirmative determination is reached at step 104, since operation is normal (an abnormality has not occurred) the control circuit 22 proceeds to step 110 after designating the current state to be normal at step 108.

Then at step 110, the control circuit 22 determines whether or not the current processing is complete. Determination is negative when self-diagnosis has not yet been performed for the power supply lines V corresponding to all the battery cells C, and processing returns to step 100 where the current processing is repeated. However, determination is affirmative when self-diagnosis has been performed for the power supply lines V corresponding to all the battery cells C, and the control circuit 22 ends the current processing.

Note that in the present exemplary embodiment, the processing of step 100 to step 110 is performed for each of the battery cells C. However there is no limitation thereto, and configuration may be made such that after the first control processing of step 100 and the second control processing of step 102 is performed for each one of all of the battery cells C, and after all the output values (A−B) and the output values (B) of the battery cells C are stored in the storage section 24, the processing of step 104 is then performed for each of the battery cells C.

As explained above, the voltage measuring circuit 30 provided to the semiconductor circuit 14 of the present exemplary embodiment includes the cell selector SW 32, the voltage measuring section 34, the reference power source 36, the reference voltage dividing resistor 38, the SW set 1, the SW set 2, the SW set 3, the SW set 4, the switching element SW7 and the switching element SW8. Moreover, the voltage measuring section 34 includes the level shift circuit 40, the AD converter 42, the switching element SW5 and the switching element SW6.

When self-diagnosis is performed, first with all the switching elements SW1 of the SW set 1 still in an OFF state, the control circuit 22 employs the first control processing to switch the switching element SW2 of the SW set 2 that connects the power supply line V at the high voltage side of the battery cell C to the reference power source 36, and the switching element SW7 to the ON state, thereby inputting the electrical signal corresponding to the reference voltage A to the cell selector SW 32. When the switching element SW4 of the SW set 4 and the switching element SW9 are switched to the ON state to give the reference voltage B divided from the reference voltage A and corresponding to the battery cell C, the switching element SW3 of the SW set 3 that connects the power supply line V on the low voltage side of the battery cell C to the reference voltage dividing resistor 38 and the switching element SW8 are switched to the ON state, thereby inputting the electrical signal corresponding to the reference voltage B to the cell selector SW 32. Due to switching the switching element SW5 to the ON state, an analogue electrical signal is accordingly input to the AD converter 42 from the level shift circuit 40, corresponding to the difference between the electrical signal corresponding to the reference voltage A input and the electrical signal corresponding to the reference voltage B. The analogue signal is converted into a digital signal by the AD converter 42 and output as the electrical signal (output value (A−B)).

Then the switching element SW6 is switched to the ON state by the second control processing, thereby inputting the reference voltage B divided by the reference voltage dividing resistor 38 directly to the AD converter 42 where it is converted into a digital signal and output as an electrical signal (the output value (B)).

Moreover, the output value (A−B) and the output value (B) obtained by the first control processing are then summed, and determination is made as to whether or not the summed value is substantially the same as the reference voltage A. An abnormality such as a defect is diagnosed to have occurred in the power supply lines V (Vn, Vn−1), in the cell selector SW 32, or in the level shift circuit 40 (in at least one thereof) when the two values are not substantially the same as each other. However, normal (no abnormality) is diagnosed when the two values are the same as each other.

In the present exemplary embodiment, self-diagnosis is performed of the input-output conversion characteristics based on the output value (A−B) output through the respective power supply lines V (Vn, Vn−1), the cell selector SW 32, and the level shift circuit 40 from the AD converter 42, and based on the output value (B) that was directly input and is output from the AD converter 42. Hence the precision of the input-output characteristics of the circuit for determination can be diagnosed even without achieving or surpassing the input-output conversion precision of the circuit for determination (for example the level shift circuit 40) in the precision of the reference voltage B. Appropriate self-diagnosis can accordingly be achieved irrespective of the precision of the reference voltage B.

In the present exemplary embodiment, a unique voltage (reference voltage B) that differs for each path (power supply line V) of the battery cells C is employed enabling defects in the cell selector SW 32 to be detected.

Note that in the present exemplary embodiment, self-diagnosis is performed employing the power supply line V connected to the high voltage side and the power supply line V connected to the low voltage side for each of the battery cells C, however there is no limitation thereto as long as two power supply lines V are employed across which a potential difference occurs. Note that it is however preferable to employ the power supply line V connected to the high voltage side and the power supply line V connected to the low voltage side for each of the battery cells C as in the present exemplary embodiment, since this enables measurement processing (a measurement processing program) to be utilized here that is normally employed to measure battery voltage of battery cells C with the voltage measuring circuit 30.

In order to measure the battery voltage between the plural battery cells C (the voltage between the highest voltage position and the lowest voltage position of the battery cell set 12 to be measured) at a single time, preferably connection is made so as to supply the reference voltage A to the power supply line V at the highest voltage position (the power supply line Vn+1 in the present exemplary embodiment) and to supply the reference voltage B to the power supply line V at the lowest voltage position (the power supply line V1 in the present exemplary embodiment).

Figure 9:
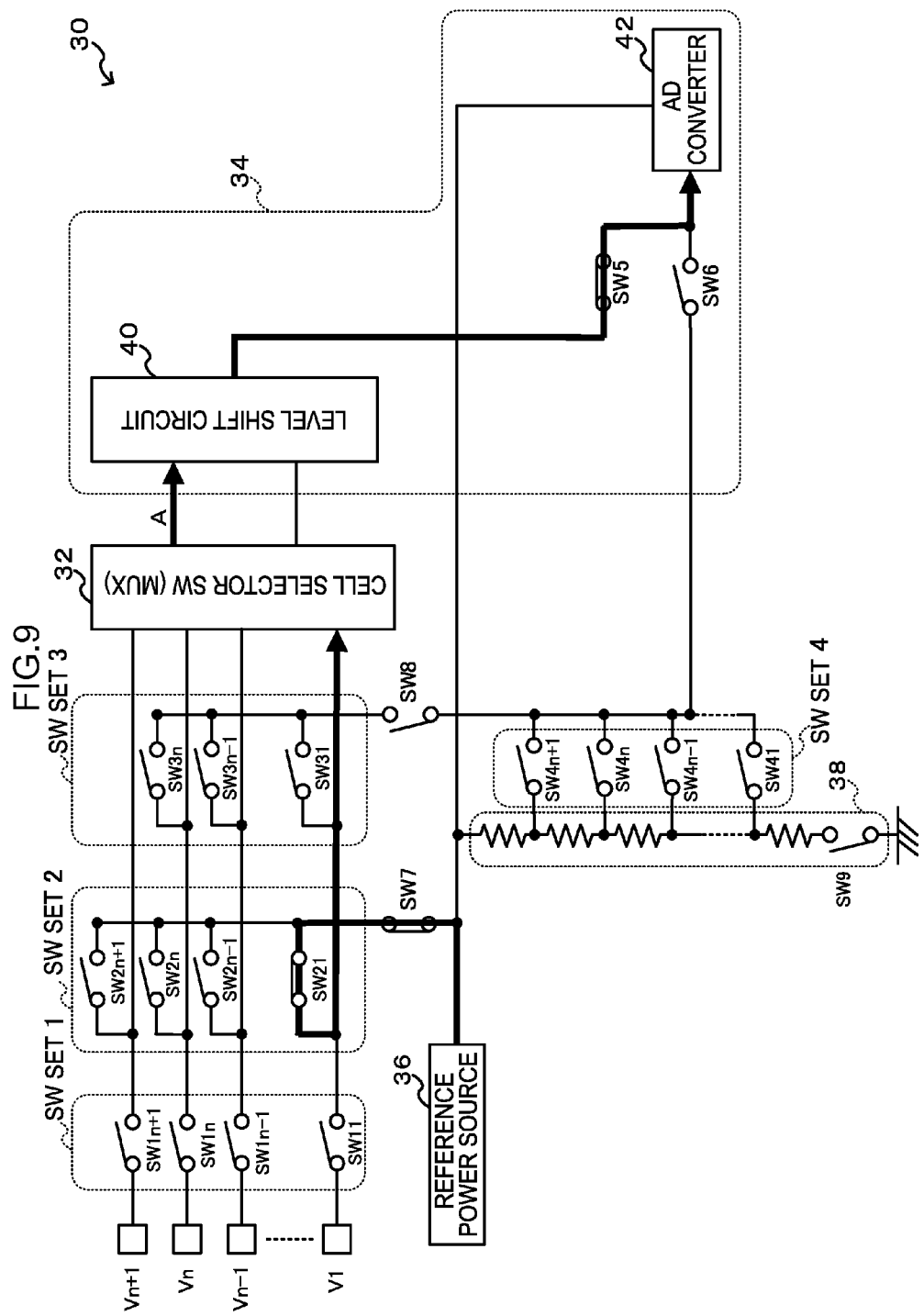
FIG. 9 is a circuit diagram illustrating a specific example of a state in a voltage measurement circuit when self-diagnosis is being performed on an power supply line V1.
Figure 10:
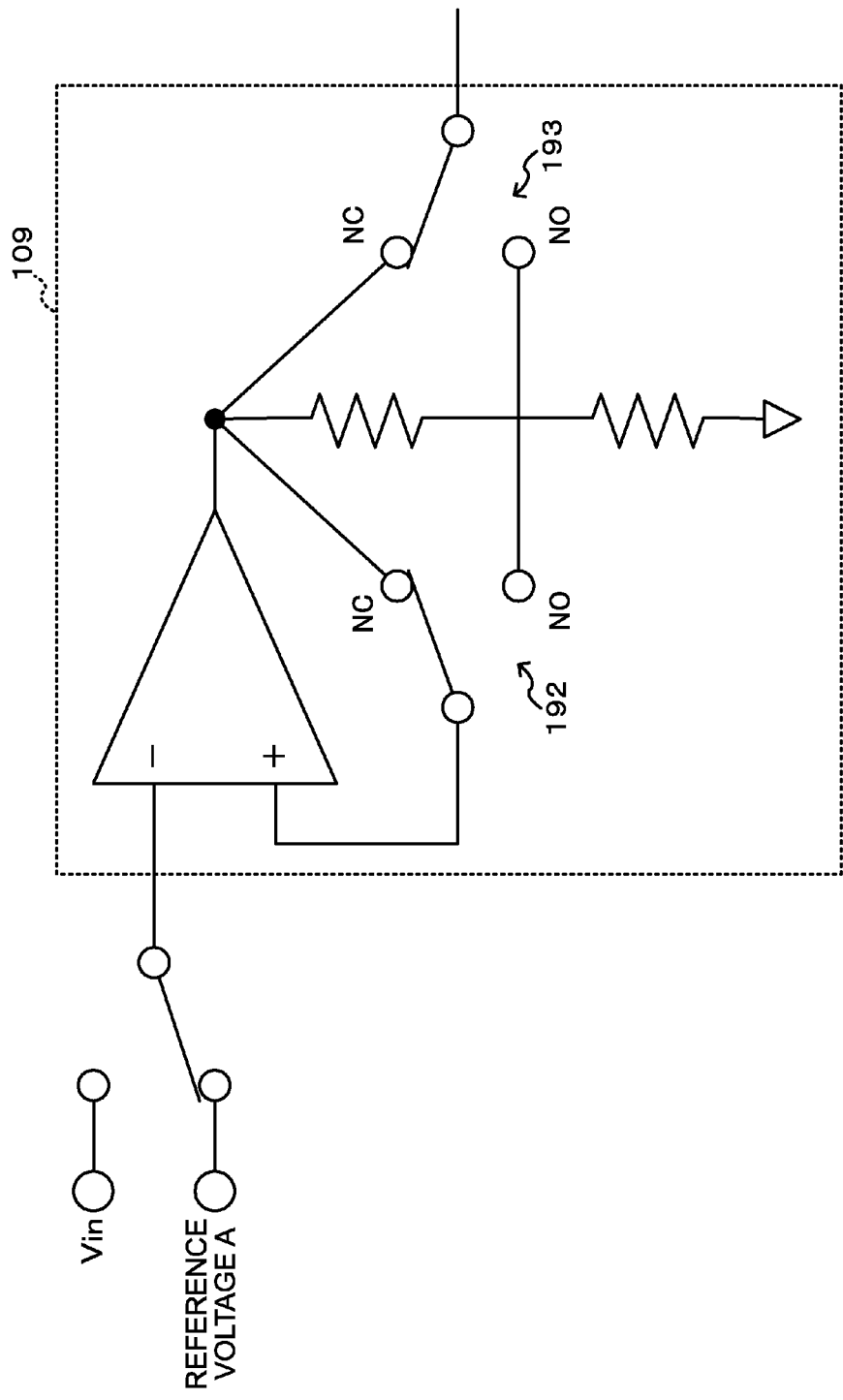
FIG. 10 is a circuit diagram illustrating an example of a schematic configuration of a digital measurement instrument equipped with a related self-diagnostic function.

Note that in the above exemplary embodiment, there is a concern with respect to the power supply line V1 that self-diagnosis might not be performed appropriately due to needing to connect the output voltage V1 at the lowest position. In such cases, for example, self-diagnosis may be performed in the following manner. As illustrated in FIG. 9, a switching element SW21 is provided to the SW set 2, the switching element SW21 and the switching element SW7 are switched to the ON state, and only the electrical signal corresponding to the reference voltage A is input to the cell selector SW 32. Only the electrical signal corresponding to the reference voltage A from the cell selector SW 32 is input to the level shift circuit 40. In this case, an electrical signal corresponding to the voltage VSS (ground voltage) is also input inside the level shift circuit 40 in place of the reference voltage B of the exemplary embodiment described above. Thus an analogue electrical signal corresponding to the difference between the reference voltage A and the voltage VSS (0V) (equivalent to the reference voltage A) is output to the AD converter 42 from the level shift circuit 40. This analogue electrical signal is converted into a digital signal in the AD converter 42 and output. Normal (no abnormality) is diagnosed in the control circuit 22 when the electrical signal output from the AD converter 42 is substantially equivalent to the reference voltage A, and an abnormality is diagnosed as having occurred when the electrical signal is not substantially equivalent to the reference voltage A.

Moreover, although in the present exemplary embodiment the reference voltage A is supplied by the reference power source 36 provided within the voltage measuring circuit 30 there is no limitation thereto. Configuration may be made such that the reference voltage A is supplied from a section external to the voltage measuring circuit 30, or even from a section external to the semiconductor circuit 14.

The configuration, defect diagnosis operation etc. of the battery monitoring system 10, the semiconductor circuit 14 and the voltage measuring circuit 30 etc. in the exemplary embodiment explained above are merely examples thereof, and various modifications thereto are possible within a scope not departing from the spirit of the present invention.

Furthermore, a computer readable storage medium according to a fourth aspect is stored with a diagnostic program that causes a computer to execute processing, the processing including: a first control procedure that, when diagnosing for an abnormality in a measurement unit that uses a conversion unit to convert to a digital signal a difference between electrical signals flowing in two power supply lines when input with the electrical signals flowing in the two power supply lines selected by a selection unit from out of plural power supply lines respectively connected to plural serially connected batteries and outputs the digital signal, controls the selection unit such that selection is made of a power supply line in which an electrical signal corresponding to a first reference voltage flows and a power supply line in which an electrical signal corresponding to a second reference voltage different from the first reference voltage flows; a second control procedure that controls the measurement unit such that an electrical signal corresponding to the second reference voltage is converted into a digital signal and output; and a computation procedure that sums together the digital signal output by the first control procedure and the digital signal output by the second control procedure and outputs the sum as an electrical signal.

According to the present invention the advantageous effect is exhibited of enabling appropriate self-diagnosis to be performed on a measurement unit.

What is claimed is:

1. A semiconductor circuit comprising:
a plurality of input terminals respectively connected to a connection part of each of a plurality of serially connected batteries;
a plurality of switches each including a first end and a second end, the first ends of the plurality of switches respectively connected to each of the plurality of input terminals;
a plurality of power supply lines each including a first end and a second end, the first ends of the plurality of power lines respectively connected to each of second ends of the plurality of switches;
a selection unit to which the second ends of the plurality of power lines are connected and that selects two power supply lines from the plurality of power supply lines;
a measurement unit that comprises an analogue signal to digital signal conversion unit and that, when input with respective electrical signals flowing in the two power supply lines selected by the selection unit, converts a difference between the electrical signals flowing in the two power supply lines into a digital signal and outputs the digital signal;
a computation unit that performs a predetermined computation on the digital signal output from the measurement unit and outputs an electrical signal corresponding to a result of the computation; and
a control unit that performs
first control processing that controls the selection unit such that a set of input terminals and the selection unit are electrically disconnected using the corresponding switches and selection is made from the plurality of power supply lines of a power supply line in which an electrical signal corresponding to a first reference voltage flows and a power supply line in which an electrical signal corresponding to a second reference voltage different from the first reference voltage flows, and
second control processing that controls the measurement unit such that an electrical signal corresponding to the second reference voltage is converted into a digital signal and output.

2. The semiconductor circuit of claim 1 wherein the computation unit sums the digital signal output by the control unit with the first control processing and the digital signal output by the conversion unit with the second control processing, and outputs the summed electrical signal.

3. The semiconductor circuit of claim 1 further comprising a determination unit that determines whether or not the electrical signal output by the computation unit is substantially the same as the electrical signal corresponding to the first reference voltage.

4. The semiconductor circuit of claim 1 wherein:
the measurement unit comprises a level shift section that outputs a difference between electrical signals respectively flowing in the two power supply lines selected by the selection unit as an analogue signal; and
the conversion unit converts the analogue signal output from the level shift section to a digital signal.

5. The semiconductor circuit of claim 1 wherein:
the second reference voltage is a predetermined voltage corresponding to each power supply line.

6. The semiconductor circuit of claim 1 wherein the control unit controls such that in the first control processing the power supply line through which the electrical signal corresponding to the first reference voltage flows is adjacent to the power supply line through which the electrical signal corresponding to the second reference voltage different from the first reference voltage flows.

7. A battery monitoring system comprising:
a plurality of serially connected batteries;

a plurality of power supply lines respectively connected to each of the plurality of batteries;

a selection unit that selects two power supply lines from the plurality of power supply lines;

a measurement unit that comprises an analogue signal to digital signal conversion unit and that, when input with electrical signals flowing in the two power supply lines selected by the selection unit, the measurement unit converts a difference between the electrical signals flowing in the two power supply lines into a digital signal and outputs the digital signal in order to monitor battery voltage of the plurality of batteries;

a computation unit that performs a predetermined computation on the digital signal output from the measurement unit and outputs an electrical signal corresponding to a result of the computation; and a control unit that when performing diagnosis for an abnormality in the measurement unit performs first control processing that controls the selection unit such that selection is made from the plurality of power supply lines of a power supply line in which an electrical signal corresponding to a first reference voltage flows and a power supply line in which an electrical signal corresponding to a second reference voltage different from the first reference voltage flows, second control processing that controls the measurement unit such that an electrical signal corresponding to the second reference voltage is converted into a digital signal and output, and a third control processing that compares a sum of a difference between the first reference voltage and the second reference voltage obtained by the first control processing and the second reference voltage obtained by the second control processing with the first reference voltage, and diagnoses an abnormality of the measurement unit.

8. A diagnosis method applied to a semiconductor circuit comprising a plurality of power supply lines respectively connected to each of a plurality of serially connected batteries, a selection unit that selects two power supply lines from the plurality of power supply lines, and a measurement unit that comprises an analogue signal to digital signal conversion unit and that, when input with respective electrical signals flowing in the two power supply lines selected by the selection unit, converts a difference between the electrical signals flowing in the two power supply lines into a digital signal and outputs the digital signal, the diagnosis method comprising:

a first control process that controls the selection unit such that selection is made from the plurality of power supply lines of a power supply line in which an electrical signal corresponding to a first reference voltage flows and a power supply line in which an electrical signal corresponding to a second reference voltage different from the first reference voltage flows;

a second control process that controls the measurement unit such that an electrical signal corresponding to the second reference voltage is converted into a digital signal and output;

a computation process that sums together the digital signal output by the first control process and the digital signal output by the second control process in a computation unit and outputs the sum as an electrical signal; and a diagnostic process that performs a comparison of the electrical signal output as the sum with the first reference voltage and diagnoses an abnormality of the measurement unit based at least partly on the comparison.

9. The semiconductor circuit according to claim 1, wherein the control unit performs third control processing that compares a sum of a difference between the first reference voltage and the second reference voltage obtained by the first control processing and the second reference voltage obtained by the second control processing with the first reference voltage, and diagnoses an abnormality of the measurement unit.

10. A semiconductor circuit comprising:

a plurality of input terminals disposed to correspond respectively to a connection part of each of a plurality of serially connected batteries;

a first wiring to which a first voltage is applied and whose first end is connected to the input terminal connected to the first end of the corresponding battery;

a second wiring to which a second voltage different from a first voltage is applied and whose first end is connected to the input terminal connected to the second end of the corresponding battery;

a comparison unit comprising a first terminal to which the second end of the first wiring is connected, a second terminal to which the second end of the second wiring is connected, and an output terminal that outputs a difference voltage of a difference between the first voltage and the second voltage;

a third wiring to which the second voltage is applied and whose first end is connected to the second wiring; and a control unit to which the output terminal and the second end of the third wiring is connected, to which the first voltage, the second voltage and the difference voltage are inputted, and that compares a sum of the difference voltage and the second voltage with the first reference voltage in order to diagnose the failure of the comparison unit.

* * * * *